United States Patent
Hurd et al.

(10) Patent No.: US 7,184,813 B1
(45) Date of Patent: *Feb. 27, 2007

(54) METHOD AND APPARATUS FOR IMPROVED METABOLITE SIGNAL SEPARATION IN MR SPECTROSCOPY

(75) Inventors: Ralph E. Hurd, Milpitas, CA (US); Napapon Sailasuta, Morgan Hill, CA (US)

(73) Assignee: General Electric Company, Schenectady, NY (US)

( * ) Notice: Subject to any disclaimer, the term of this patent is extended or adjusted under 35 U.S.C. 154(b) by 3 days.

This patent is subject to a terminal disclaimer.

(21) Appl. No.: 10/907,885

(22) Filed: Apr. 19, 2005

Related U.S. Application Data

(63) Continuation of application No. 10/250,260, filed on Jun. 18, 2003, now Pat. No. 6,987,997.

(51) Int. Cl.
*A61B 5/05* (2006.01)

(52) U.S. Cl. ............... 600/410; 600/407; 324/307; 324/308; 324/309; 324/310; 436/173

(58) Field of Classification Search ............... 600/407, 600/410; 324/307–310; 436/173
See application file for complete search history.

(56) References Cited

U.S. PATENT DOCUMENTS

| | | | |
|---|---|---|---|
| 5,121,059 A | 6/1992 | Wieland | |
| 5,270,654 A | 12/1993 | Feinberg et al. | |
| 5,570,019 A * | 10/1996 | Moonen et al. | 324/309 |
| 5,657,758 A | 8/1997 | Posse et al. | |
| 5,709,208 A | 1/1998 | Posse et al. | |
| 5,879,299 A | 3/1999 | Posse et al. | |
| 6,069,478 A | 5/2000 | Hurd | |
| 6,104,191 A | 8/2000 | Hurd | |
| 6,529,763 B1 * | 3/2003 | Cohen et al. | 600/410 |
| 6,987,997 B1 * | 1/2006 | Hurd et al. | 600/410 |

* cited by examiner

*Primary Examiner*—Brian L. Casler
*Assistant Examiner*—William Jung
(74) *Attorney, Agent, or Firm*—Ziolkowski Patent Solutions Group, SC; Michael A. Della Penna; Carl B. Horton

(57) ABSTRACT

A technique is set forth for MR spectroscopy that is capable of reducing signal overlap between metabolite signals for improved clinical analysis of metabolite content. The technique includes varying an echo time across a scanning dimension. Once a span of echo time for an acquisition dimension is determined, and the number of acquisition data points is known, a variance between echo times can be determined. A pulse sequence with differing echo times is then applied for each frame, and after data is acquired, an image is reconstructed that significantly improves metabolite signal separation.

29 Claims, 4 Drawing Sheets

METHOD AND APPARATUS FOR IMPROVED METABOLITE SIGNAL SEPARATION IN MR SPECTROSCOPY

CROSS-REFERENCE TO RELATED APPLICATION

The present application is a continuation and claims priority of U.S. Ser. No. 10/250,260 filed Jun. 18, 2003, now U.S. Pat. No. 6,987,997.

BACKGROUND OF THE INVENTION

The present invention relates generally to MR spectroscopy, and more particularly, to a technique that is capable of segregating metabolite signals for improved clinical analysis.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of nuclear magnetic resonance imaging for the determination of individual chemical compounds is known as MR spectroscopy (MRS). The underlying principle of MRS is that atomic nuclei are surrounded by a cloud of electrons which very slightly shield the nucleus from any external magnetic field. As a structure of the electron cloud is specific to an individual molecule or compound, the magnitude of this screening effect is then also a characteristic of the chemical environment of individual nuclei. In view of the fact that the resonant frequency is proportional to the magnetic field it experiences, the resonant frequency can be determined not only by the external applied field, but also by the small field shift generated by the electron cloud. This shift in frequency is called the chemical shift. It is noted that the chemical shift is a very small effect and is usually expressed as "parts per million" (PPM) of the main frequency. In order to resolve the different chemical species, it is therefore necessary to achieve very high levels of homogeneity of the main magnetic field $B_0$.

In the context of human MRS, two nuclei are of particular interest, $H^1$ and $P^{31}$. Proton MR spectroscopy is mainly employed in studies of the brain where prominent peaks arise from certain metabolites. Phosphorus 31 MR spectroscopy detects compounds involved in energy metabolism in certain compounds related to membrane synthesis and degradation. Metabolites of particular interest in MRS studies include glutamate (Glu), glutamine (Gln), choline (Cho), creatine (Cre), N-acetylaspartate (NAA), and the inositols (ml and sl).

Glu is the principal excitatory neurotransmitter of the central nervous system. In brain, Glu, Gln, and Glu/Gln-enzymes are compartmentalized within neurons and glial cells (astrocytes). Transient increases in extracellular Glu ($Glu_0$) associated with neruotransmission is important for normal brain function. From the synaptic space, $Glu_0$ is recycled and internalized by glial cells and converted to Gln. This normal cycle prevents glutamate from accumulating in the extracellular compartment where it binds to membrane receptors, such as N-methyl-D-aspartate (NMDA) and ampa-kainate proteins. Prolonged extracellular exposure to high $Glu_0$, however, is toxic. Excess $Glu_0$ in the synaptic space can trigger a toxic cascade, via NMDA receptors, leading to neuronal and non-neuronal (oligodendrocyte) cell death because of excessive accumulation of intracellular calcium, which in turn leads to free radicals and nitric oxide production as well as formation of apoptotic bodies. This neural excitotoxicity cascade might have a key role in a number of neurodegenerative diseases, including MS, AD, ALS, HD, and as a bystander effect in stroke and brain trauma. Even gliomas have been found to respond to glutamate antagonists. Although $Glu_0$ is probably below detectability by whole body 3T MR spectroscopy, intracellular concentrations of both Glu and Gln are high enough for MRS detection. In conventional proton spectra, the overlapped signals of Glu and Gln are readily measured as total Glu+Gln (Glx). Some studies have shown increases in Glx for severe abnormalities such as hypoxic encephalopathy, acute MS lesions, HD, ALS, and certain tumors. Decreases in the Glx signal have also been reported. Unfortunately, Glx does not measure changes in Glu/Gln status, and is therefore unlikely to be an adequate marker for less profound changes in intracellular conditions, which may proceed or accompany conditions of toxic $Glu_0$. Spectral overlap of Gln, Glu, NAA, and ml make it difficult to reliably sort out Glu and Gln individually in conventional spectra.

It would therefore be advantageous to have a technique to provide improved in vivo spectroscopic measurement of metabolites, such as glutamate, glutamine, choline, creatine, N-acetylaspartate and the inositols.

BRIEF DESCRIPTION OF THE INVENTION

The present invention solves the aforementioned drawbacks in MR spectroscopy of metabolites by varying the echo time across the acquisition dimension so that overlap of various metabolite signals is significantly reduced. This technique therefore provides improved in vivo spectroscopic measurement of metabolites, such as glutamate (Glu), glutamine (Gln), choline (Cho), creatine (Cre), N-acetylaspartate (NAA), and the inositols (ml and sl). In application, the technique provides direct measurement of Glu and Gln in human brain spectroscopy by significantly reducing overlap of the resulting signals from these metabolites, as well as from signals from other molecules such as GABA, glutathione, and macro-molecular components.

In accordance with one aspect of the invention, a method of MR spectroscopy is disclosed that reduces signal overlap from metabolites. The technique includes determining a plurality of echo times over a TE averaged dimension, determining a number of data acquisition points, and varying an echo time in duration from one data acquisition to another across the TE averaged dimension based on the number of data acquisition points. This technique is effective at detecting spatial distribution of metabolite signals to segregate metabolite signals for clinical analysis.

In accordance with another aspect of the invention, an apparatus is disclosed to acquire MR spectroscopy images having metabolite distinction. The apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed receive a desired average echo time for an acquisition dimension and a desired number of acquisition points. A variance from one echo time to another can then be determined. This system then applies a pulse sequence with differing echo times, although not every echo time must be different. Data is acquired in an image that is reconstructed with improved metabolite signal separation that is due to the differing echo times.

In accordance with yet another aspect of the invention a computer program is disclosed having a set of instructions which, when executed by a computer, causes the computer to apply a pulse sequence having a plurality of data acquisition echo times that are averaged over an acquisition period, wherein at least three echo times are differing in length. The program also includes instructions to reconstruct an MR image, the MR image having distinction between various metabolite signals.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
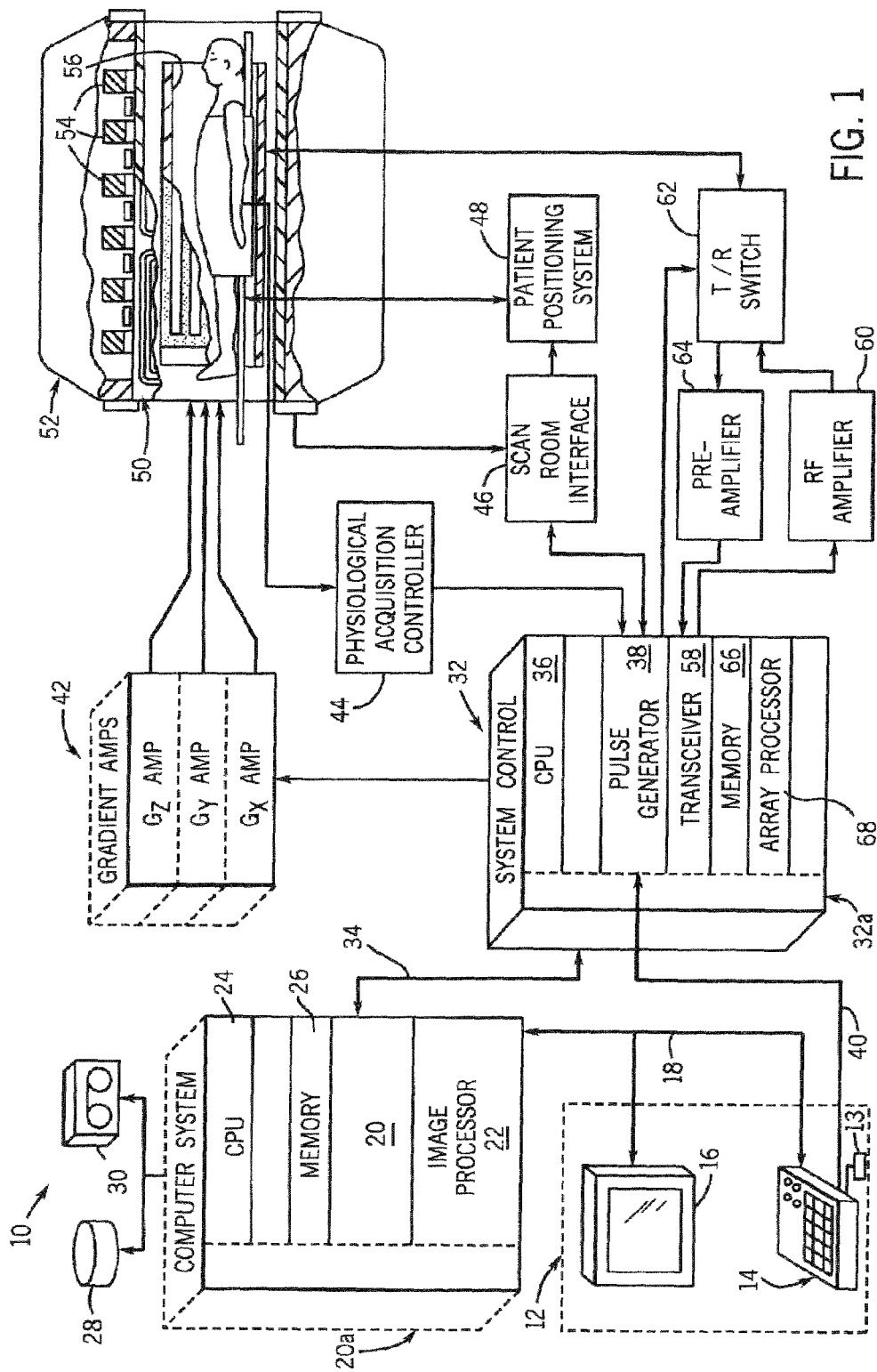
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images.

The invention includes a technique that provides improved in vivo spectroscopic measurement of metabolites that reduces signal overlap in the metabolites of interest. In general, the invention includes determining a number of different echo times over a TE averaged dimension and determining a number of data acquisition points. The echo time (TE) is varied in duration from one data acquisition to another across the TE averaged dimension based on the number of data acquisition points. After acquiring data, the data is then averaged based on the number of different echo times. In this manner, a significant reduction in signal overlap from metabolites of interest is achieved in the TE-averaged data, thereby allowing the detection of spatial distribution of metabolite signals to segregate metabolite signals for clinical analysis. This technique of TE-averaging can also be accomplished using an FFT in the TE-averaging dimension and extraction of zero frequency spectrum.

The invention is implemented in a system such as that described with reference to FIG. 1 wherein the processing computer is programmed to receive an initial echo time and a desired span of echo time for an acquisition dimension. A desired number of acquisition points is determined as well as a variance from one echo time to another. A pulse sequence is then applied with differing echo times to acquire data and reconstruct a spectrum or spectral image with improved metabolite signal separation. Alternately, the span of echo times used in TE-averaging can be provided as a listing.

The invention is also implemented in a computer program stored on a computer readable storage medium that, when executed by a computer, causes the computer to apply a pulse sequence having a number of data acquisition echo times that are averaged over an acquisition period, wherein at least three of those echo times are different in duration. An MR image is then reconstructed having distinction between various metabolite signals.

Figure 2:
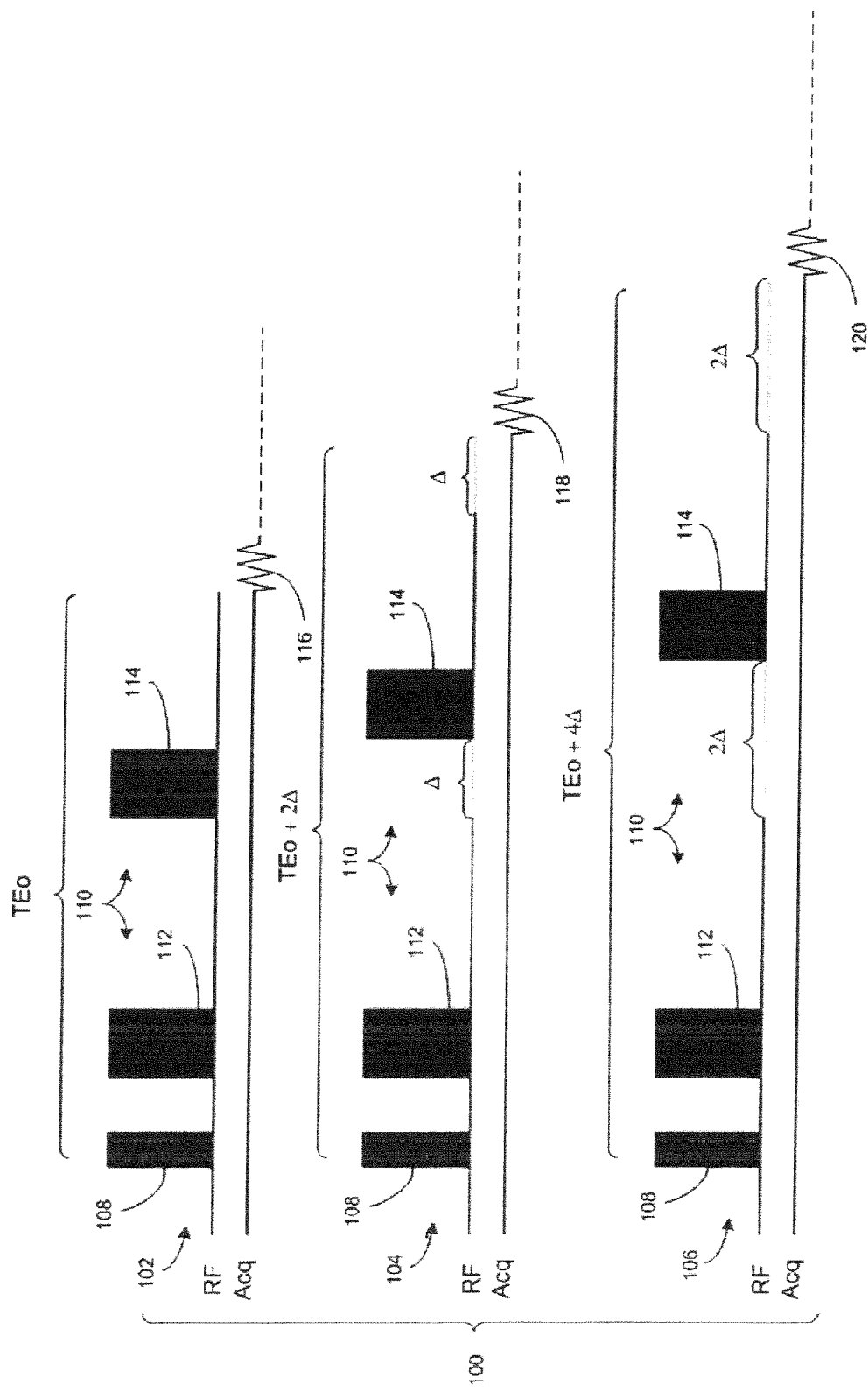
FIG. 2 is a schematic representation of a portion of a pulse sequence and data acquisition scheme that can be implemented in the system of FIG. 1 in accordance with one embodiment of the present invention.

In a preferred embodiment, as shown in FIG. 2, a pulse sequence 100 for three frames 102, 104, and 106 is shown in which a variance from one echo time (TE) to another is fixed across the acquisition dimension. The echo times are incremented the fixed variance from a nominal value, such as that shown in Frame 102, to that of Frame 104, and then to Frame 106, and so on. Each frame sequence includes an excitation RF pulse 108, followed by a set of refocusing RF pulses 110 that includes a first refocusing RF pulse 112, which is substantially the same for each frame. The first refocusing RF pulse 112 is played out a time te1 from the excitation pulse 108 and is followed by a second refocusing RF pulse 114 at a time of $TE_0/2$. This combination of RF pulses generates an echo 116 centered at $TE_0/2$-te1 following RF pulse 114. As indicated in the exemplary technique 100, the total echo time of Frame 102, designated as $TE_0$, is the time from the excitation RF pulse 108 to the echo 116. This time is increased, or incremented, by $2\Delta$ in Frame 104 such that the total echo time of Frame 104 is $TE_0+2\Delta$, and is incremented by another $2\Delta$ for Frame 106 for a total echo time of $TE_0+4\Delta$. In general then, the total echo time for Frame n is $TE_0+2(n-1)\Delta$. As one skilled in the art will readily recognize, for 3D volume selection, the aforementioned sequence would be accompanied by three mutually orthogonal gradient pulses for each frame. In this case, a double spin echo (PRESS) acquisition scheme is used.

There are many ways to vary the echo times. Incrementing a fixed increment is just one example and is the current preferred embodiment. Equivalently, the echo times may be varied a non-fixed amount and/or may be decremented as well. These and other techniques are contemplated and are within the scope of the present invention.

Figure 3:
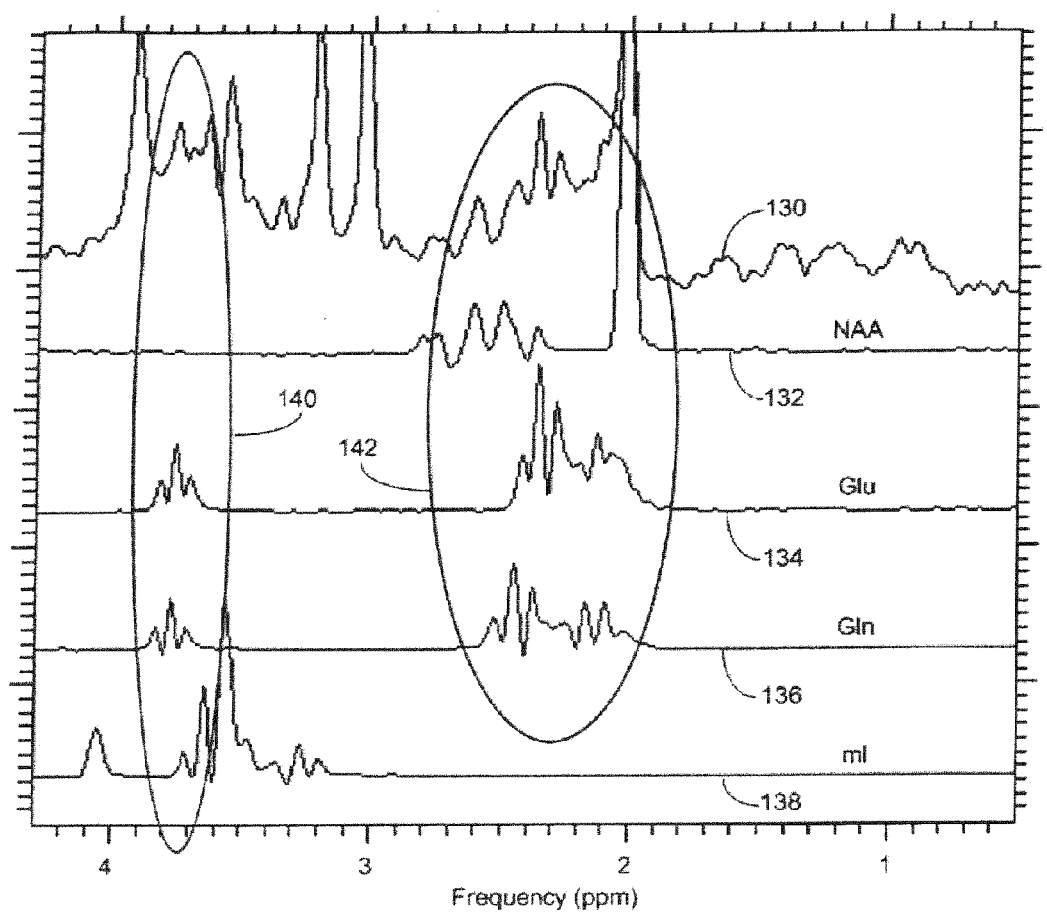
FIG. 3 is a graphical representation of several metabolites versus frequency depicting results from a conventional MR spectroscopy examination.

A particular application of the aforementioned spectroscopy technique is for automated in vivo detection of glutamate (Glu) and glutamine (Gln). As previously described, the signals from Gln and Glu are typically severally overlapped with one another, and with the signals from other molecules such as NAA, and ml as shown in FIG. 3. The graph of FIG. 3 shows the spectra acquired using a conventional acquisition scheme, known as PRESS, having TE of 35, TR of 2000 in a 3T scanner. Typical in vivo data 130 is shown on the top of the scale and individual chemical responses are depicted below for NAA 132, Glu 134, Gln 136, and ml 138. As indicated in the two areas of interest 140 and 142, severe spectral overlap occurs across the metabolite signals that make it extremely difficult to quantify individual metabolite signals. At field strengths normally used for clinical MR spectroscopy (1.5T and 3.0T), even prior knowledge fitting programs are forced to fit a sum of Glu+Gln (Glx) to determine tissue levels. According to recent research on the excitotoxicity events associated with a shift in Glu:Gln, it would be advantageous to measure both Glu and Gln, rather than a sum of these components, commonly referred to as Glx.

Figure 4:
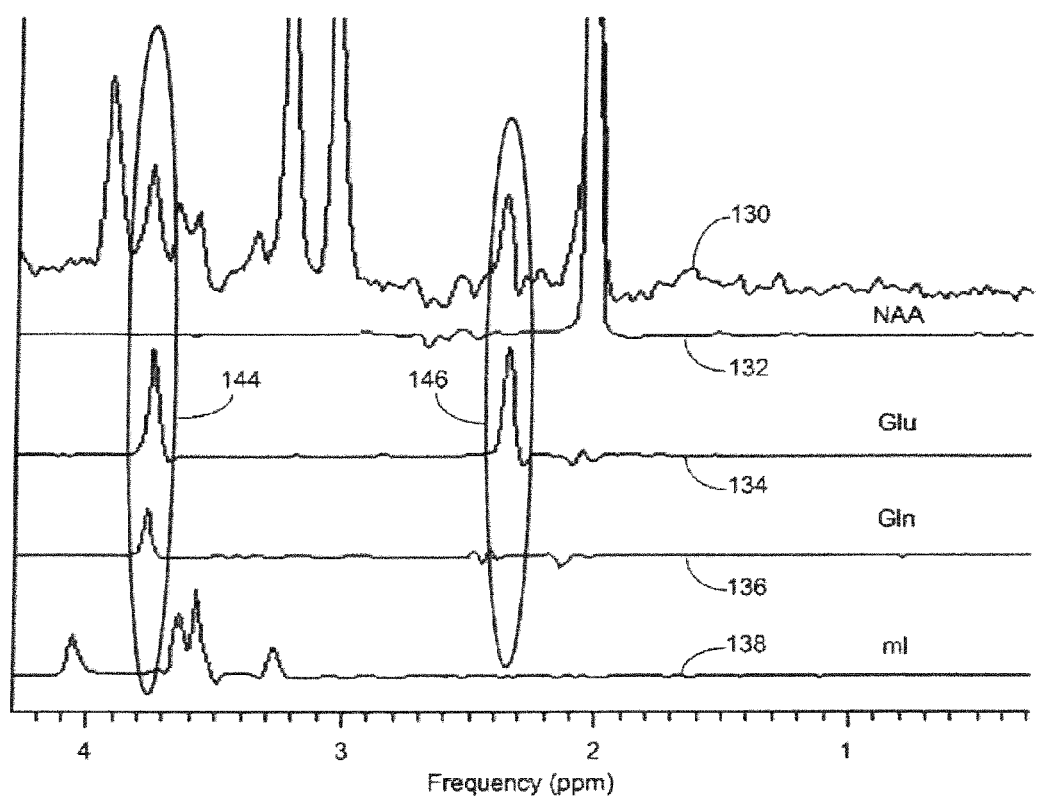
FIG. 4 is a graphical representation, similar to that of FIG. 3, showing the results of the pulse sequence of FIG. 2 implemented in an MR spectroscopy examination.

Implementing the aforementioned scheme provides for direct measurement of Glu and Gln in human brain spectra at 3T, as shown in FIG. 4. Similar to FIG. 3, FIG. 4 shows various metabolite spectra. Like numerals are used to identify the similar signals. However, as shown in the two areas of interest 144 and 146, with implementation of the present invention, significant signal differentiation is achieved. By incrementing TE from a nominal minimal value of approximately 30 ms., to at least 115 ms., TE averaging simplifies spectral patterns for NAA 132, Glu 134, Gln 136, and ml 138. As indicated in the areas of interest 144 and 146, the Glu signal acquired in 146 is easily subtracted from that acquired in 144 to provide a measurement of Gln. It is also contemplated that larger and/or non-linear steps in the t1 dimension can also be used, especially in conventional MRSI, where sampling time is dominated by k-space encoding.

Using this TE averaged technique with PRESS provides sufficient resolution for improved quantification at 3T and above, for the tissue levels of various metabolites, specifically, Glu, Gln, ml, $NA_{tot}$, Cho, and Cre. However, given the variation of T2 across a normal population, it may be advantageous to calculate individual T2 from the data prior to TE-averaging for absolute quantification.

It is also noted that while excellent data was acquired by averaging TE from 35 ms. to 335 ms., in 128 steps of 2.5 ms. and NEX of 2, and TR of 2 sec., substantially equivalent data was acquired in 64 steps of 2.5 ms. averaging TE from 35 ms. to 195 ms., 2 NEX and 2 sec. TR and also for example 16 steps of 10 ms., averaging over the same span of TE.

Accordingly, this technique provides optimized spectra for quantitative measurement of metabolites providing a good baseline and sufficient resolution at relatively short effective TE values, and with relatively few points in t1.

Additionally, to determine metabolite levels independent of $T_2$ variability in any given subject, if prior to TE averaging, $T_2$ relaxation and estimated signal at TE=0 is determined, this data can be used in concert with a standard phantom to provide independent metabolite levels. Such phantoms include the GE MRS HD phantom from GE Medical Systems, Waukesha, Wis., part/model no. 2152220.

It is also contemplated that each frame of TE data can be phase corrected using a residual water signal. Additionally, a water reference point can be included to correct any frequency and phase errors. Water reference can also include a TE-averaged frame of unsuppressed data.

The present invention has been described in terms of the preferred embodiment, and it is recognized that equivalents, alternatives, and modifications, aside from those expressly stated, are possible and within the scope of the appending claims.

What is claimed is:

1. A method of MR spectroscopy to reduce signal overlap from metabolites comprising the steps of:
   determining a plurality of echo times (TE) of different lengths within a single selected data acquisition session;
   acquiring data during a set of TEs that comprises the plurality of TEs of different lengths within the single selected data acquisition session;
   averaging the data acquired within the single selected data acquisition session; and
   detecting spatial distribution of metabolite signals to segregate metabolite signals for clinical analysis from the averaged data within the single selected data acquisition session.

2. The method of claim 1 wherein the step of averaging the data acquired comprises:
   determining an initial echo time ($TE_0$);
   determining a number of data acquisition points;
   varying TE in duration from one data acquisition to another across the TE averaged dimension based on the number of data acquisition points and $TE_0$;
   accumulating data acquired for the plurality of different TEs; and
   dividing the accumulated data by the number of data acquisition points.

3. The method of claim 1 further comprising incrementing TE from one data acquisition to a next.

4. The method of claim 3 wherein the increments are linear and thus inversely proportional to t1-bandwidth.

5. The method of claim 3 wherein the TE is incremental from a minimal value to at least 115 ms.

6. The method of claim 1 further comprising providing signal separation for Glu and Glu+Gln.

7. The method of claim 6 further comprising subtracting a Glu signal acquired from a Glu+Gln signal acquired to provide a measurement of Gln within the single selected data acquisition session for employment to reconstruct an MR image.

8. The method of claim 1 further comprising detecting spatial distribution for a specified therapy:
   reconstructing an image of molecular structure for the specified therapy; and
   adjusting a dose for the specified therapy based on the image reconstructed.

9. The method of claim 1 wherein the number of data acquisition points ranges from approximately 7 to 128 and wherein the TE is incremented beginning at approximately 30 ms.

10. The method of claim 1 further comprising applying a double spin echo acquisition sequence for volume selection.

11. The method of claim 1 further comprising calculating absolute tissue signal levels of metabolites.

12. The method of claim 1 wherein the step of averaging the data acquired comprises:
    averaging the data acquired within the single selected data acquisition session based on a number of the plurality of different TEs of different lengths employed within the single selected data acquisition session to cause a reduction in signal overlap of target metabolites for reconstruction of an MR image.

13. The method of claim 12 wherein the step of detecting the spatial distribution comprises:
    detecting the spatial distribution of metabolite signals to segregate target metabolite signals for clinical analysis through employment of the reduction in signal overlap of the target metabolites from the averaged data based on the number of the plurality of different TEs of different lengths employed within the single selected data acquisition session to cause the reduction in signal overlap of target metabolites for reconstruction of the MR image.

14. The method of claim 1 further comprising directly measuring glutamate (Glu) and glutamine (Gln) in human brain spectroscopy through employment of the spatial distribution of metabolite signals within the single selected data acquisition session for employment to reconstruct an MR image.

15. An apparatus to acquire MR spectroscopy images having metabolite distinction comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        receive an input indicative of a desired number of acquisition frames within a single selected data acquisition session;
        receive an input indicative of a desired span of echo time (TE) for a first acquisition frame dimension within the single selected data acquisition session;
        calculate a variance from the desired TE for a second acquisition frame within the single selected data acquisition session; and
        apply a pulse sequence with differing TEs to acquire at least a first and a second acquisition frame of data within the single selected data acquisition session and reconstruct an image with improved metabolite signal separation.

16. The apparatus of claim 15 further comprising a phantom having therein an equivalent mixture of at least two of: Glu, Gln, NAA, Choline, Creatine, myo-Inositol, and GABA.

17. The apparatus of claim 15 wherein the magnet is capable of producing a magnetic field of at least 3 Tesla, and the computer is further programmed to resolve glutamate signals at 2.35 ppm from glutamine, N-acetylaspartate, and co-resonant compound signals.

18. The apparatus of claim 15 wherein the computer is further programmed to employ a variance from the desired TE for a third acquisition frame that is fixed across the third acquisition frame within the single selected data acquisition session.

19. The apparatus of claim 15 wherein the computer is further programmed to acquire TE averaged spin echo data, wherein each spin echo time is varied in duration such that various metabolite signals can be segregated in the reconstructed image.

20. The apparatus of claim 19 wherein the variance in duration of each spin TE is a fixed increment from one TE to a next and data acquired is averaged over the span of TE.

21. The apparatus of claim 15 wherein the computer is further programmed to apply an FFT and extract a zero-frequency spectrum to calculate an average in echo times.

22. The apparatus of claim 15 wherein the computer is further programmed to initially determine $T_2$ relaxation and estimate metabolite signal at TE=0, and use standard phantom acquisition data to provide metabolite levels independent of $T_2$ variability in a subject.

23. The apparatus of claim 15 wherein the variance is a fixed increment and TEs range from approximately 30 ms. through 115 ms.

24. A computer readable storage medium having stored thereon a computer program representing a set of instructions that when executed by a computer causes the computer to:
apply a pulse sequence having a plurality of data acquisition echo times (TEs) that are averaged over an acquisition period within a single selected data acquisition session preparatory to reconstruction of an MR image, wherein at least three of the TEs differ in duration; and
reconstruct the MR image having distinction between various metabolite signals.

25. The computer readable storage medium of claim 24 wherein the reconstructed MR image resolves co-resonant signals of glutamate and glutamine from myo-Inositol signals and other co-resonant signals.

26. The computer readable storage medium of claim 24 wherein the reconstructed MR image resolves N-acetyl resonances from confounding glutamate signals.

27. The computer program of claim 24 having further instructions to cause the computer to phase correct each frame of TE data with a residual water signal.

28. The computer program of claim 24 having further instructions to cause the computer to obtain a water reference point and correct any frequency and phase errors using the water reference point obtained.

29. The computer program of claim 24 having further instructions to cause the computer to calculate an absolute tissue level of a plurality of metabolite signals from the reconstructed image.

* * * * *